United States Patent
Liu et al.

(10) Patent No.: US 11,374,201 B2
(45) Date of Patent: Jun. 28, 2022

(54) THIN FILM PACKAGE STRUCTURE, THIN FILM PACKAGE METHOD, AND DISPLAY PANEL

(71) Applicant: KUNSHAN GO-VISIONOX OPTO-ELECTRONICS CO., LTD., Kunshan (CN)

(72) Inventors: Quan Liu, Kunshan (CN); Lu Zhang, Kunshan (CN); Zhenzhen Han, Kunshan (CN); Siming Hu, Kunshan (CN); Hui Zhu, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 665 days.

(21) Appl. No.: 16/324,652

(22) PCT Filed: Apr. 28, 2018

(86) PCT No.: PCT/CN2018/085052
§ 371 (c)(1),
(2) Date: Feb. 11, 2019

(87) PCT Pub. No.: WO2019/041864
PCT Pub. Date: Mar. 7, 2019

(65) Prior Publication Data
US 2021/0336216 A1 Oct. 28, 2021

(30) Foreign Application Priority Data
Aug. 31, 2017 (CN) .......................... 201710772356.0

(51) Int. Cl.
*H01L 51/52* (2006.01)
*H01L 27/32* (2006.01)

(52) U.S. Cl.
CPC ...... *H01L 51/5256* (2013.01); *H01L 51/5246* (2013.01); *H01L 51/5253* (2013.01); *H01L 27/3246* (2013.01)

(58) Field of Classification Search
CPC ... H01L 51/5246; H01L 51/5253–5256; H01L 51/56; H01L 27/3244
See application file for complete search history.

(56) References Cited

U.S. PATENT DOCUMENTS

2009/0267487 A1* 10/2009 Kwack ................ H01L 51/5259
313/503
2010/0225875 A1* 9/2010 Wang .................... G02F 1/1339
174/254

(Continued)

FOREIGN PATENT DOCUMENTS

CN 103794733 A 5/2014
CN 105140418 A 12/2015

(Continued)

OTHER PUBLICATIONS

Office Action dated Jun. 19, 2020 in corresponding Korean Application No. 10-2019-7019719; 20 pages including English-language translation.

(Continued)

*Primary Examiner* — Errol V Fernandes
*Assistant Examiner* — Jeremy J Joy
(74) *Attorney, Agent, or Firm* — Maier & Maier, PLLC

(57) ABSTRACT

A thin film package structure, a thin film package method, and a display panel are disclosed. The thin film package structure includes a substrate, an organic adhesive layer, and a package film layer. The package film layer covers the substrate and the organic adhesive layer. The organic adhesive layer in the non-display region is designed to have a groove structure and an embankment structure defined by the groove structure. The groove structure and the embank- (Continued)

ment structure surround the display region. At least one of the groove structures and the embankment structure is a structure extending in a zigzag form or a grid-shaped structure. The organic adhesive layer is disposed in the non-display region of the substrate, and is designed to have multiple zigzagging or grid-shaped groove structures.

14 Claims, 6 Drawing Sheets

(56) References Cited

U.S. PATENT DOCUMENTS

| | | | | |
|---|---|---|---|---|
| 2010/0258346 A1* | 10/2010 | Chen | ........................ | H01L 23/564 174/521 |
| 2012/0064278 A1* | 3/2012 | Chen | ................... | H01L 51/5246 216/33 |
| 2013/0334959 A1* | 12/2013 | Wang | ................... | H01L 51/5256 313/512 |
| 2014/0118975 A1* | 5/2014 | Chen | ................... | H01L 51/5246 361/761 |
| 2014/0319474 A1* | 10/2014 | Kim | ........................ | H01L 51/524 257/40 |
| 2015/0060786 A1* | 3/2015 | Kwak | ................... | H01L 51/5253 257/40 |
| 2016/0254479 A1* | 9/2016 | Jeong | ................... | H01L 51/5246 257/40 |
| 2017/0244063 A1* | 8/2017 | Furuie | ................... | H01L 27/3272 |

FOREIGN PATENT DOCUMENTS

| | | | | | |
|---|---|---|---|---|---|
| CN | 205789979 | U | | 12/2016 | |
| CN | 205789979 | U | * | 12/2016 | |
| CN | 205985076 | U | * | 2/2017 | |
| CN | 106816551 | A | | 6/2017 | |
| CN | 106816551 | A | * | 6/2017 | ......... H01L 51/5253 |
| CN | 106847855 | A | | 6/2017 | |
| CN | 106847855 | A | * | 6/2017 | ............. H01L 23/29 |
| CN | 106848107 | A | * | 6/2017 | |
| CN | 106848107 | A | | 6/2017 | |
| CN | 106981584 | A | | 7/2017 | |
| CN | 106997930 | A | | 8/2017 | |
| CN | 106997930 | A | * | 8/2017 | ......... H01L 51/5253 |
| CN | 107104124 | A | | 8/2017 | |
| CN | 107689425 | A | | 2/2018 | |
| CN | 207381403 | U | * | 5/2018 | ............. H01L 27/12 |
| CN | 107104124 | B | * | 12/2020 | ............. H01L 23/31 |
| JP | 2016-091630 | A | | 5/2016 | |
| JP | 2017-147165 | A | | 8/2017 | |
| KR | 100751376 | B1 | | 8/2007 | |
| KR | 20170098148 | A | | 8/2017 | |
| TW | 201444137 | A | | 11/2014 | |

OTHER PUBLICATIONS

Office Action dated Aug. 4, 2020 in corresponding Japanese Application No. 2019-537151; 6 pages; Machine translation attached.
Office Action dated Sep. 10, 2019, in corresponding Chinese Application No. 201710772356.0 including partial machine-generated English language translation; 12 pages.
Office Action dated Jul. 2, 2019 in corresponding Taiwanese Application No. 10820626580; 6 pages including English-language translation of the Search Report.
International Search Report dated Jul. 25, 2018 in corresponding International application No. PCT/CN2018/085052; 5 pages including Partial English-language translation.
Chinese Office Action dated Nov. 9, 2018, in connection with corresponding CN Application No. 201710772356.0; 16 pages.

* cited by examiner

THIN FILM PACKAGE STRUCTURE, THIN FILM PACKAGE METHOD, AND DISPLAY PANEL

CROSS-REFERENCE TO RELATED APPLICATION

This application claims the priority of Chinese Patent Application No. 201710772356.0, filed on Aug. 31, 2017, and the entire contents of which are incorporated herein by reference.

TECHNICAL FIELD

The present application relates to the field of display technologies, and in particular, to a thin film package structure, a thin film package method, and a display panel.

BACKGROUND

An organic light-emitting device is a current-type semiconductor light-emitting device. Due to advantages such as active illumination, high luminous efficiency, and no limitation on the viewing angle, the organic light-emitting device is widely applied in lighting and display fields. The organic light-emitting device emits light by using an organic light-emitting diode (OLED) therein. The OLED is sensitive to external factors such as water vapor and oxygen, and may be reduced in stability and lifespan if exposed to the water vapor and oxygen. Therefore, the use of an effective package structure can prevent entering of water vapor and oxygen, and prolong the lifespan of the OLED.

In the existing thin film package technology, a method that has a desirable effect is alternately stacking an organic layer and an inorganic layer. This method can enhance the flexibility of the inorganic layer to prevent the inorganic layer from easily breaking, and further strengthen the resistance of the organic layer to water vapor and oxygen. However, the water vapor and oxygen from the periphery area of the OLED can easily enter into the OLED through gaps between the organic layers and the inorganic layers, leading to a reduction of the luminous performance of the OLED. More seriously, the whole organic light-emitting device is likely to shut down.

SUMMARY OF THE APPLICATION

An objective of the present application is to provide a package structure, which prolongs a path through which water vapor and oxygen enter into a flexible display device, lowers an influence of the water vapor and oxygen on the flexible display device, and further improves an anti-bending ability of the display device.

Another objective of the present application is to provide a display panel, which prolongs a path through which water vapor and oxygen enter into a flexible display device, lowers an influence of the water vapor and oxygen on the flexible display device, and further improves an anti-bending ability of the display device.

A thin film package structure includes: a substrate, an organic adhesive layer, and a package film layer, wherein the organic adhesive layer is provided on the substrate, the package film layer covers the organic adhesive layer, and the organic adhesive layer is formed with a groove structure.

The groove structure is an uncrossed groove structure that extends in a zigzag form.

The groove structure is a crossed groove structure with a grid shape.

The substrate includes a display region and a non-display region surrounding the display region; and the organic adhesive layer is formed with an embankment structure which surrounds the display region.

The embankment structure and the groove structure are arranged side by side.

The groove structure is disposed in the embankment structure.

The groove structure is a continuous groove structure.

The groove structure is a discontinuous groove structure disposed in the embankment structure in a separated manner.

The present application also provides a display panel comprising a thin film package structure. The thin film package structure comprises: a substrate, an organic adhesive layer, and a package film layer, wherein the organic adhesive layer is provided on the substrate, the package film layer covers the organic adhesive layer, and the organic adhesive layer is formed with a groove structure.

The groove structure is an uncrossed groove structure that extends in a zigzag form.

The groove structure is a crossed groove structure with a grid shape.

The substrate comprises a display region and a non-display region surrounding the display region, and wherein the organic adhesive layer is formed with an embankment structure surrounding the display region.

The embankment structure and the groove structure are arranged side by side.

The groove structure is disposed in the embankment structure.

The groove structure is a continuous groove structure.

The groove structure is a discontinuous groove structure disposed in the embankment structure in a separated manner.

The present application also provides a thin film package method, used to realize a packaging to form a display panel, wherein the display panel includes a display region and a non-display region surrounding the display region, and the thin film package method includes the following steps:

providing a substrate;

forming an organic adhesive layer on the substrate, wherein the organic adhesive layer in the non-display region is formed with a groove structure and an embankment structure defined by the groove structure; the groove structure and the embankment structure surround the display region; and at least one of the groove structure and the embankment structure is a structure extending in a zigzag form or a grid-shaped structure; and covering the substrate with a package film layer, filling the package film layer in the non-display region into the groove structure.

In the embodiments of the present application, by configuring the organic adhesive layer to have a groove structure, an inorganic layer in the package film layer can be in contact with the substrate to realize a sealing. Since the substrate and the package film layer have a first layer deposited by the inorganic layer, a package effect can be effectively improved, and water and oxygen are prevented from entering.

DETAILED DESCRIPTION

To further explain the technical means used by the present application to achieve the intended purpose and the efficacy of the present application, the specific embodiments, structures, features and functions of the present application are described in detail below with reference to the accompanying drawings and preferred embodiments.

Figure 1:
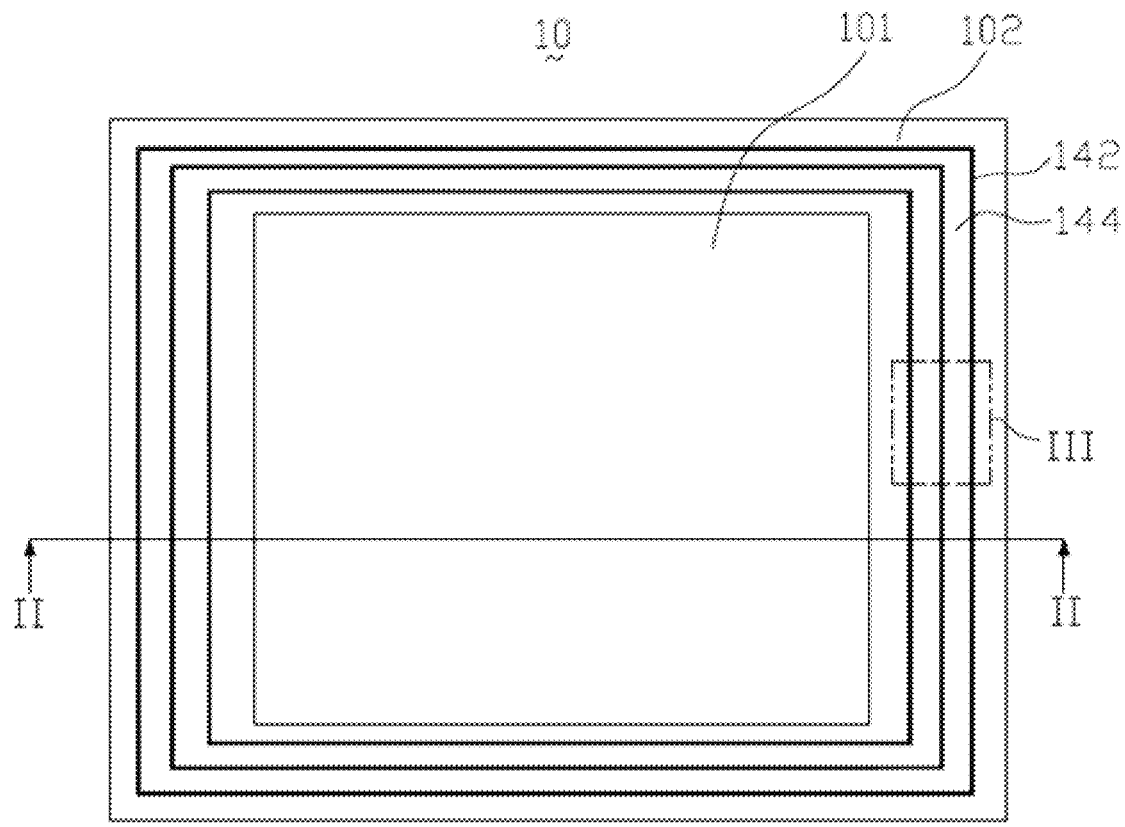
FIG. 1 is a schematic top view of a display panel of the present application.
Figure 2:
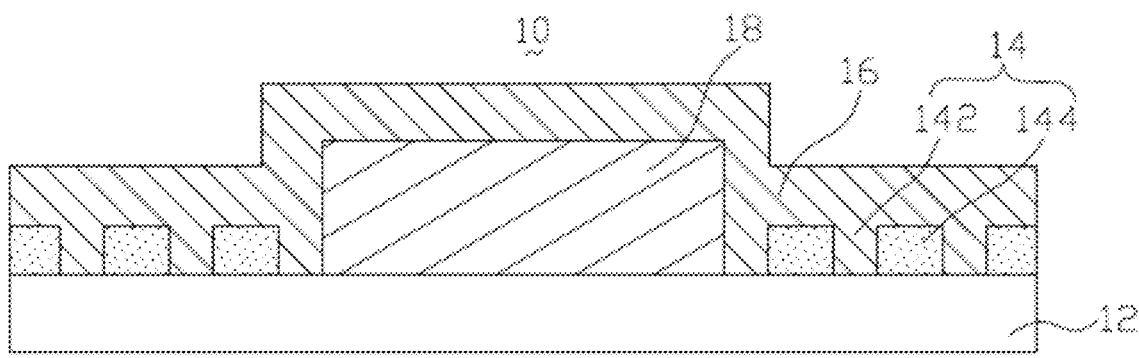
FIG. 2 is a cross-sectional schematic view along the line II-II in FIG. 1.

FIG. 1 is a schematic top view of a display panel of the present application. FIG. 2 is a cross-sectional schematic view along the line II-II in FIG. 1. As shown in FIG. 1 and FIG. 2, the present application provides a display panel 10, which includes a substrate 12. The substrate 12 includes a display region 101 and a non-display region 102 surrounding the display region 101. A light-emitting device 18 is provided on the display region 101 of the substrate 12, and the substrate 12 is covered with a package film layer 16. Specifically, the package film layer 16 covers the non-display region 102 and the light-emitting device 18. In the embodiment of the present application, the package film layer 16 is formed by alternately stacking an inorganic layer and an organic layer. Further, an organic adhesive layer 14 is provided between the package film layer 16 and the substrate 12. The organic adhesive layer 14 is arranged in the non-display region 102 of the substrate 12. Specifically, the organic adhesive layer 14 is provided on the substrate 12, and is arranged in the non-display region 102. The organic adhesive layer 14 is formed with a groove structure 142 and/or an embankment structure 144. Preferably, the groove structure 142 exposes the substrate 12, and the groove structure 142 is filled by the package film layer 16 in the non-display region 102. By designing the organic adhesive layer to have a groove structure, the inorganic layer in the package film layer can be in contact with the substrate to realize a sealing. Since the substrate and the package film layer have a first layer deposited by the inorganic layer, a package effect can be effectively improved, and water and oxygen are better prevented from entering.

In an embodiment, the groove structure 142 is an uncrossed groove structure that extends in a zigzag form. In other embodiments of the present application, the groove structure 142 may also be a crossed groove structure that extends in a zigzag form. The organic adhesive layer 14 is designed to also have an embankment structure 144 which surrounds the display region 101. The embankment structure 144 and the groove structure 142 are arranged side by side. The groove structure 142 is disposed in the embankment structure 144, and is a continuous groove structure.

In other embodiments, the groove structure 142 may also be a discontinuous groove structure disposed in the embankment structure 144 in a separated manner. In other embodiments, the groove structure 142 may also be a crossed groove structure with a grid shape.

The groove structure 142 and the embankment structure 144 of this embodiment are described in detail below with reference to the accompanying drawings.

A thin film package structure includes a substrate 12, an organic adhesive layer 14, and a package film layer 16. The organic adhesive layer 14 is provided on the substrate 12, and the package film layer 16 covers the substrate 12 and the organic adhesive layer 14. The organic adhesive layer 14 is disposed in the non-display region 102, and is designed to have the groove structure 142 and the embankment structure 144 defined by the groove structure 142. The groove structure 142 and the embankment structure 144 surround the display region 101. At least one of the groove structure 142 and the embankment structure 144 is a structure extending in a zigzag form or a grid-shaped structure. The groove structure 142 and the embankment structure 144 surround the display region 101 in a square shape.

Figure 3:
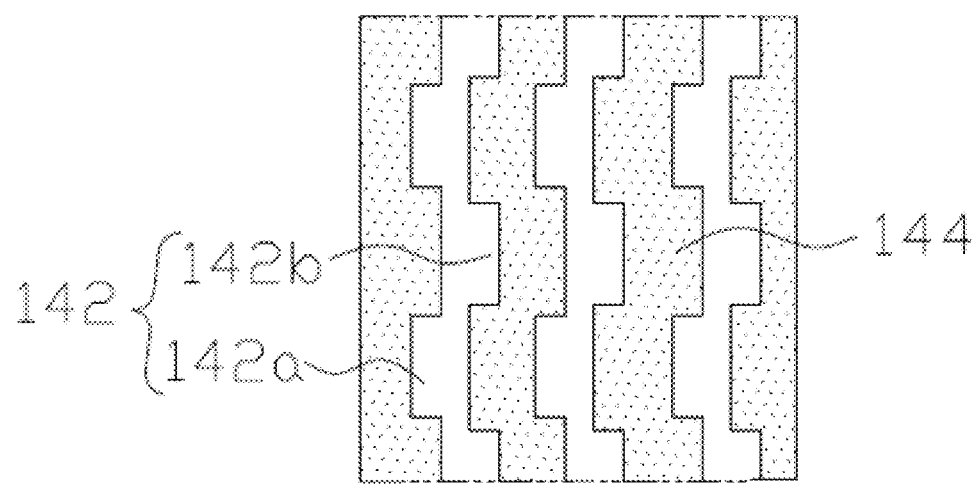
FIG. 3 is a schematic top view of an organic adhesive layer in the region III in FIG. 1.

Alternatively, FIG. 3 is a schematic top view of an organic adhesive layer in the region III in FIG. 1. As shown in FIG. 3, the groove structure 142 and the embankment structure 144 are both in a structure extending in a zigzag form.

Specifically, there are at least two groove structures 142 and at least two embankment structures 144. The at least two groove structures 142 and the at least two embankment structures 144 are alternately arranged from the edge of the display panel 10 towards the center of the display panel 10.

Figure 4:
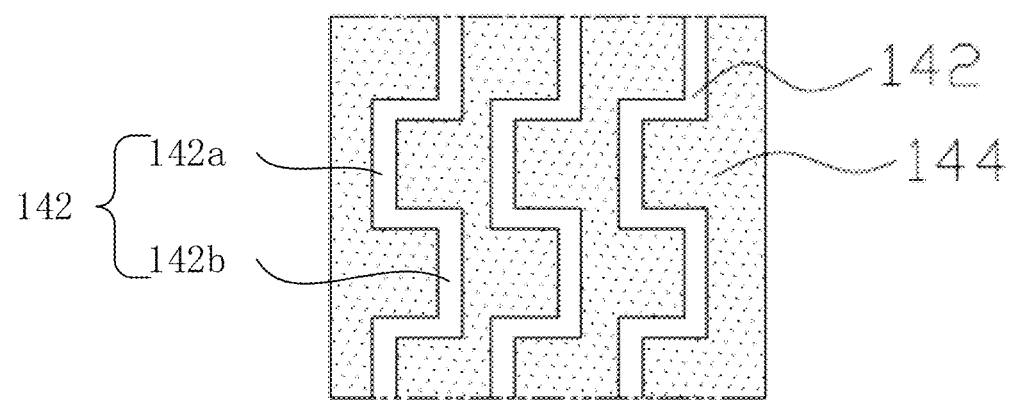
FIG. 4 is a schematic top view of an organic adhesive layer in another embodiment of the present application.
Figure 5:
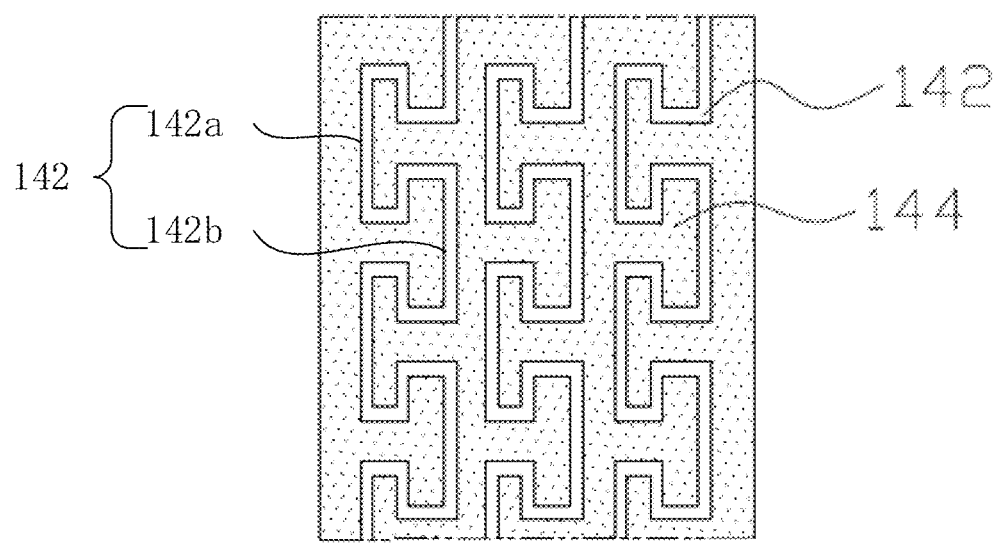
FIG. 5 is a schematic top view of an organic adhesive layer in another embodiment of the present application.
Figure 6:
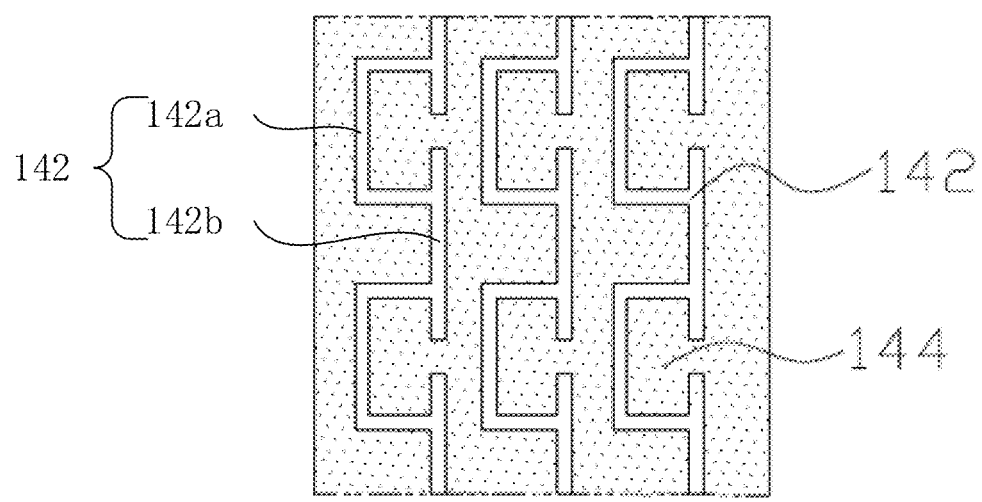
FIG. 6 is a schematic top view of an organic adhesive layer in another embodiment of the present application.

The groove structure 142 includes multiple first grooves 142a and multiple second grooves 142b. The multiple first grooves 142a and the multiple second grooves 142b are concavely designed in reverse directions and are alternately arranged along an extension direction of the groove structure 142. In this embodiment, the multiple first grooves 142a and the multiple second grooves 142b are in regular shapes or irregular shapes. In other embodiments, the groove structure 142 may also be a structure that is formed by alternately arranging multiple first grooves 142a and multiple second grooves 142b and extends in a zigzag form, as shown in FIGS. 4, 5, and 6. The first grooves 142a and the second grooves 142b may be formed by bending a linear groove. The first grooves 142a and the second grooves 142b may be integrally formed. That is, the first grooves 142a and the second grooves 142b may integrally serve as a repetitive unit.

Figure 7:
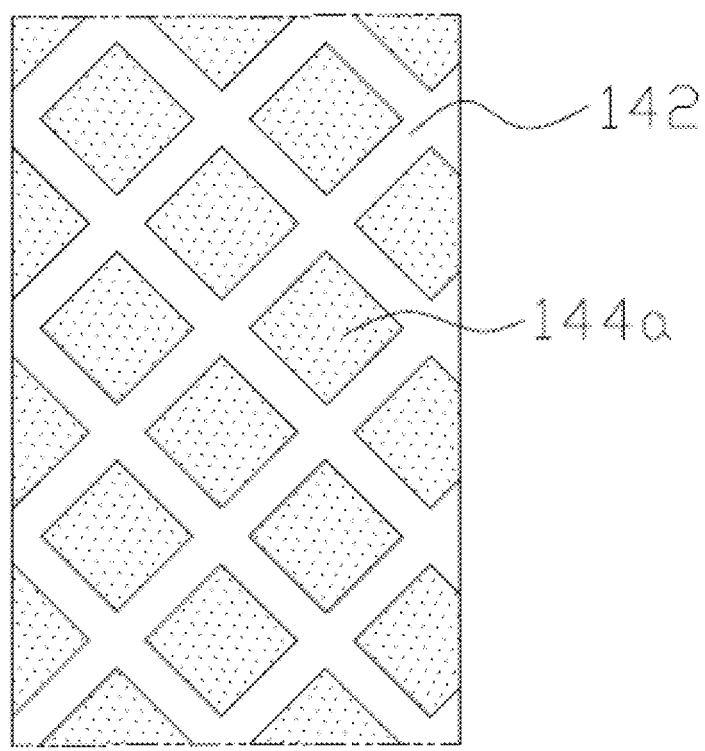
FIG. 7 is a schematic top view of an organic adhesive layer in another embodiment of the present application.
Figure 8:
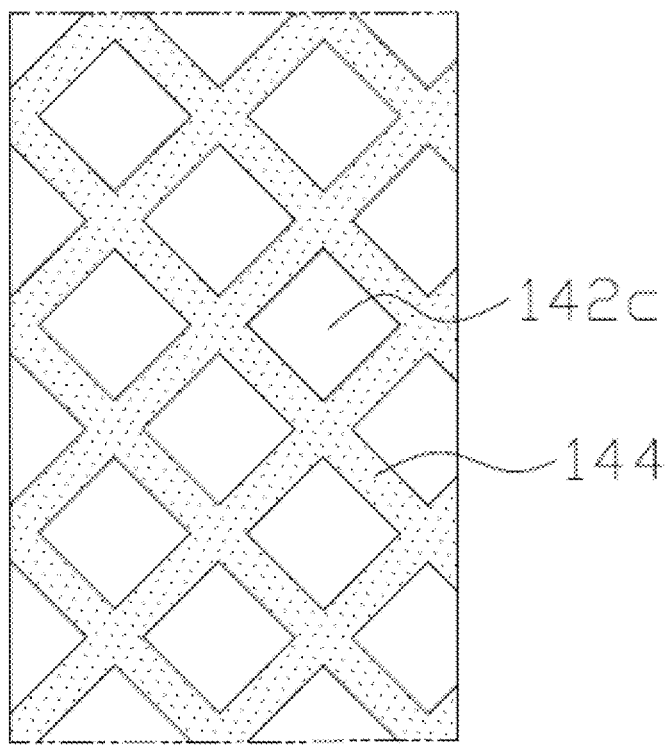
FIG. 8 is a schematic top view of an organic adhesive layer in a further embodiment of the present application.
Figure 9:
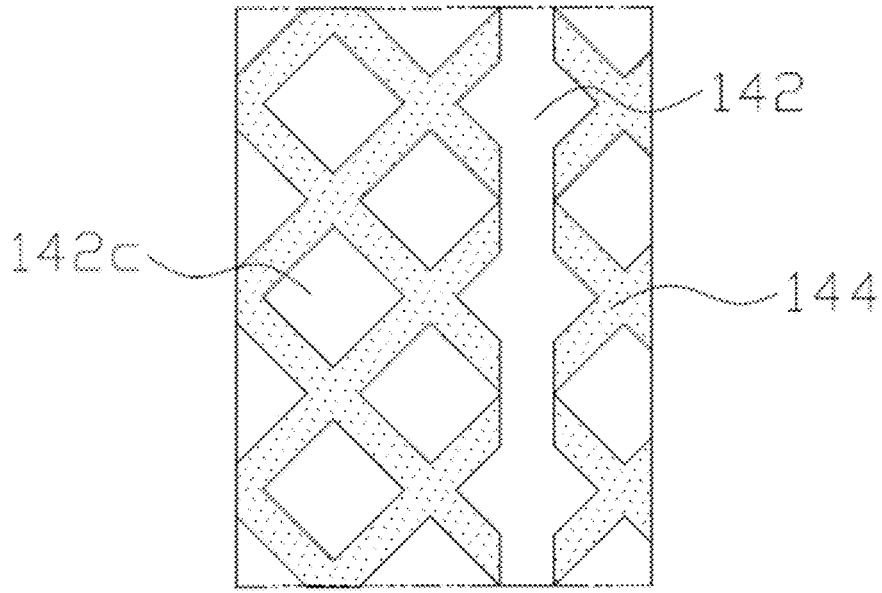
FIG. 9 is a schematic top view of an organic adhesive layer in a further embodiment of the present application.

Alternatively, the groove structure 142 may be a grid-shaped structure. The embankment structure 144 includes multiple block structures 144a which are disconnected and each of the multiple block structures 144a is separately embedded in the mesh of the groove structure 142, as shown in FIG. 7. In another embodiment, the embankment structure 144 is a grid-shaped structure. The groove structure 142 includes multiple grooves 142c which are disconnected and each of the multiple grooves 142c is separately embedded in the mesh of the embankment structure 144, as shown in FIG. 8. Based on the groove structure 142 in FIG. 8, the grooves 142c in one column may also be interconnected so as to form a combined structure with the grooves 142c in the adjacent column that are disconnected, as shown in FIG. 9.

In this embodiment, the organic adhesive layer 14 in the non-display region 102 of the substrate 12 is designed to have groove structures 142, such that a water-oxygen diffusion path is more tortuous. Thus, a water-oxygen permeation path is prolonged and a package effect of the display panel 10 is improved. Moreover, by arranging a zigzagging groove structure 142 or a groove structure 142 with a discrete distribution, the bending stress produced in bending of an edge region of the display panel 10 can be reduced or decentralized so that the bending performance of the edge region of the display panel 10 can be improved. The groove structures and the embankment structures 144 are arranged around the display region 101 by a nested combination, so that a small space is taken up, a width limitation on the non-display region 102 caused by arranging multiple barriers around a screen to prevent entering of water and oxygen in the prior art is eliminated and a narrow bezel design is realized.

Figure 10:
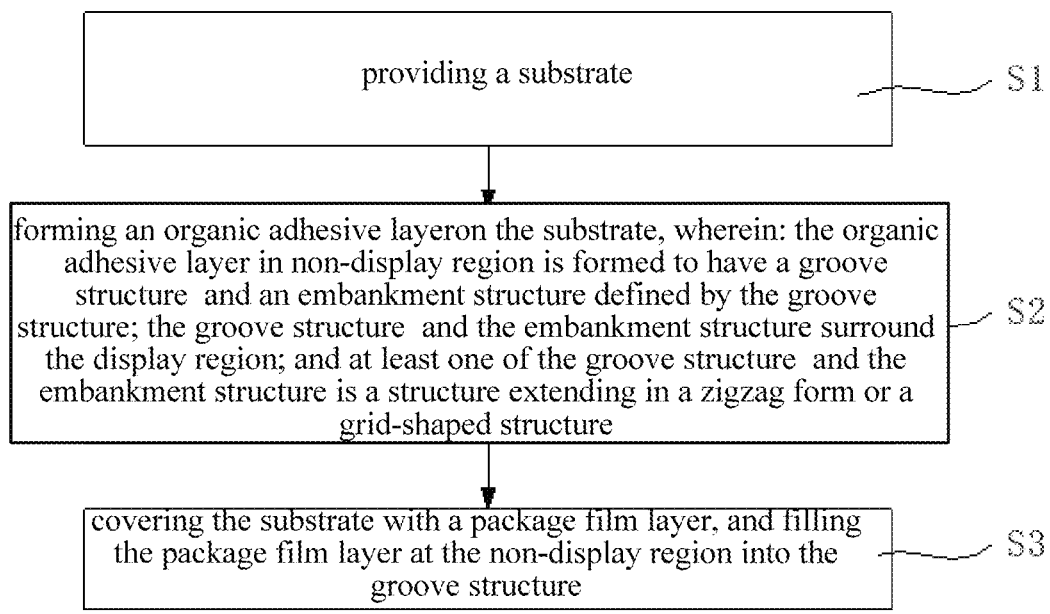
FIG. 10 is a flow chart block diagram of a thin film package method in an embodiment of the present application.

The present application also provides a thin film package method, used to realize a packaging to form a display panel 10. The display panel 10 includes a display region 101 and a non-display region 102 surrounding the display region 101. As shown in FIG. 10, the thin film package method includes the following steps:

S1: providing a substrate 12;

S2: forming an organic adhesive layer 14 on the substrate 12, wherein the organic adhesive layer 14 in the non-display region 102 is designed to have a groove structure 142 and an embankment structure 144 defined by the groove structure 142; the groove structure 142 and the embankment structure 144 surround the display region 101; and at least one of the groove structure 142 and the embankment structure 144 is a structure extending in a zigzag form or a grid-shaped structure; and S3: covering the substrate 12 with a package film layer 16, filling the package film layer 16 in the non-display region into the groove structure 142.

The present application also provides a display panel 10, which includes a light-emitting display device 18 and the above-described thin film package structure for packaging the light-emitting display device 18.

In the embodiment of the present application, the organic adhesive layer 14 in the non-display region 102 of the substrate 12 is designed to have groove structures 142, such that a water-oxygen diffusion path is more tortuous. Thus, a water-oxygen permeation path is prolonged and a package effect of the display panel 10 is improved. Moreover, by arranging a zigzagging groove structure 142 or a groove structure 142 with a discrete distribution, the bending stress produced in bending of an edge region of the display panel 10 can be reduced or decentralized, thus the bending performance of the edge region of the display panel 10 is improved. The groove structures and the embankment structures 144 are arranged around the display region 101 by a nested combination, so that a small space is integrally taken up, a width limitation on the non-display region 102 caused by arranging multiple barriers around a screen to prevent entering of water and oxygen in the prior art is eliminated, and a narrow bezel design is realized.

The above merely describes preferred embodiments of the present application, and is not intended to limit the present application in any form. Although disclosed above by using the preferred embodiments, the present application is not limited thereto. Without departing from the scope of the technical solutions of the present application, those skilled in the art can make variations or modifications to form equivalent embodiments according to the technical content disclosed above. Any easy variations, equivalent changes and modifications made to the foregoing embodiments according to the technical essence of the present application without departing from the content of the technical solutions of the present application shall fall within the scope of the technical solutions of the present application.

What is claimed is:

1. A thin film package structure, comprising:
   a substrate;
   an organic adhesive layer; and
   a package film layer, wherein the organic adhesive layer is provided on the substrate, the package film layer covers the organic adhesive layer, and the organic adhesive layer is formed with a groove structure,
   wherein the groove structure is filled by the package film layer formed by alternately stacking an inorganic layer and an organic layer, and wherein the package film layer has the inorganic layer in contact with the substrate,
   wherein the groove structure includes a crossed groove structure with a grid shape, wherein the substrate includes a display region and a non-display region surrounding the display region, and wherein the organic adhesive layer is formed with an embankment structure surrounding the display region,
   wherein the embankment structure includes multiple block structures which are disconnected and each of the multiple block structures is separately embedded in a mesh of the groove structure.

2. The thin film package structure according to claim 1, wherein the groove structure is an uncrossed groove structure that extends in a zigzag form.

3. The thin film package structure according to claim 1, wherein the embankment structure and the groove structure are arranged side by side.

4. The thin film package structure according to claim 3, wherein the groove structure is disposed in the embankment structure.

5. The thin film package structure according to claim 4, wherein the groove structure is a continuous groove structure.

6. The thin film package structure according to claim 4, wherein the groove structure is a discontinuous groove structure disposed in the embankment structure in a separated manner.

7. The thin film package structure according to claim 1, wherein the groove structure includes a plurality of first grooves and a plurality of second grooves, wherein the plurality of first grooves and the plurality of second grooves are concavely designed in reverse directions and are alternately arranged along an extension direction of the groove structure, and wherein the groove structure surrounds a display region.

8. A display panel, comprising:
   a thin film package structure, wherein the thin film package structure comprises:
   a substrate;
   an organic adhesive layer; and
   a package film layer, wherein the organic adhesive layer is provided on the substrate, the package film layer covers the organic adhesive layer, and the organic adhesive layer is formed with a groove structure,
   wherein the groove structure is filled by the package film layer formed by alternately stacking an inorganic layer and an organic layer, and wherein the package film layer has the inorganic layer in contact with the substrate,
   wherein the groove structure includes a crossed groove structure with a grid shape, wherein the substrate includes a display region and a non-display region surrounding the display region, and wherein the organic adhesive layer is formed with an embankment structure surrounding the display region,
wherein the embankment structure includes multiple block structures which are disconnected and each of the multiple block structures is separately embedded in a mesh of the groove structure.

9. The display panel according to claim 8, wherein the groove structure is an uncrossed groove structure that extends in a zigzag form.

10. The display panel according to claim 8, wherein the embankment structure and the groove structure are arranged side by side.

11. The display panel according to claim 10, wherein the groove structure is disposed in the embankment structure.

12. The display panel according to claim 11, wherein the groove structure is a continuous groove structure.

13. The display panel according to claim 11, wherein the groove structure is a discontinuous groove structure disposed in the embankment structure in a separated manner.

14. A thin film package method, used to realize a packaging to form a display panel, wherein the display panel comprises a display region and a non-display region surrounding the display region, the thin film package method comprising:
providing a substrate;
forming an organic adhesive layer on the substrate, wherein the organic adhesive layer in the non-display region is formed with a groove structure and an embankment structure defined by the groove structure; the groove structure and the embankment structure surround the display region; and at least one of the groove structures and the embankment structure is a structure extending in a zigzag form or a grid-shaped structure; and
covering the substrate with a package film layer, filling the package film layer in the non-display region into the groove structure,
wherein the groove structure is filled by the package film layer formed by alternately stacking an inorganic layer and an organic layer, and wherein the package film layer has the inorganic layer in contact with the substrate,
wherein the groove structure includes a crossed groove structure with a grid shape, wherein the substrate includes a display region and a non-display region surrounding the display region, and wherein the organic adhesive layer is formed with an embankment structure surrounding the display region,
wherein the embankment structure includes multiple block structures which are disconnected and each of the multiple block structures is separately embedded in a mesh of the groove structure.

* * * * *